United States Patent [19]

Chooi et al.

[11] Patent Number: 5,948,701
[45] Date of Patent: Sep. 7, 1999

[54] SELF-ALIGNED CONTACT (SAC) ETCHING USING POLYMER-BUILDING CHEMISTRY

[75] Inventors: Simon Chooi; Mei-Sheng Zhou; Jian Xun Li, all of Singapore, Singapore

[73] Assignee: Chartered Semiconductor Manufacturing, Ltd., Singapore, Singapore

[21] Appl. No.: 08/902,846

[22] Filed: Jul. 30, 1997

[51] Int. Cl.[6] .............................................. H01L 21/3065
[52] U.S. Cl. ......................... 438/694; 438/694; 438/695; 438/703; 438/706; 438/709; 438/711; 438/723; 438/724; 438/725; 438/761
[58] Field of Search .................................. 438/694–695, 438/703, 706, 709, 711, 723, 724–725, 761–763, 778–781, 783–784, 786–794

[56] References Cited

U.S. PATENT DOCUMENTS

| | | | |
|---|---|---|---|
| 5,126,006 | 6/1992 | Cronin et al. | 438/740 |
| 5,275,972 | 1/1994 | Ogawa et al. | 438/624 |
| 5,431,778 | 7/1995 | Dahm et al. | 156/662.1 |
| 5,436,188 | 7/1995 | Chen | 438/702 |
| 5,447,598 | 9/1995 | Mihara et al. | 216/46 |
| 5,501,998 | 3/1996 | Chen | 438/396 |
| 5,538,822 | 7/1996 | Cooper et al. | 438/766 |
| 5,643,819 | 7/1997 | Tseng et al. | 438/396 |
| 5,677,557 | 10/1997 | Wuu et al. | 257/382 |
| 5,817,579 | 4/1998 | Ko et al. | 438/766 |

*Primary Examiner*—Charles Bowers
*Assistant Examiner*—Thanh Nguyen
*Attorney, Agent, or Firm*—George O. Saile; Rosemary L. S. Pike; Alek P. Szecsy

[57] ABSTRACT

A method for forming a via through a dielectric layer within a microelectronics fabrication. There is first provided a substrate employed within a microelectronics fabrication. There is then formed upon the substrate a pair of microelectronic structures. There is then formed sequentially upon the substrate including the pair of microelectronic structures a first conformal dielectric layer followed by a second conformal dielectric layer followed by a third dielectric layer, where the second conformal dielectric layer serves as an etch stop layer with respect to the third dielectric layer in a first plasma etch method employed in forming in part a via through the third dielectric layer, the second conformal dielectric layer and the first conformal dielectric layer at a location between the pair of microelectronic structures. The first plasma etch method employs an etchant gas composition which forms a passivating fluorocarbon polymer layer upon non-horizontal portions of the third dielectric layer, the second conformal dielectric layer and the first conformal dielectric layer. There is then formed upon the third dielectric layer a patterned photoresist layer which defines the location between the pair of structures to be formed the via through the third dielectric layer, the second conformal dielectric layer and the first conformal dielectric layer. There is then etched through the first plasma etch method the third dielectric layer and the second conformal dielectric layer to form a partial via while forming the passivating fluorocarbon polymer layer upon non-horizontal portions of the third dielectric layer, the second conformal dielectric layer and the first dielectric layer. Finally, there is then etched through a second plasma etch method the first conformal dielectric layer to form the via through the third dielectric layer, the second conformal dielectric layer and the first conformal dielectric layer.

10 Claims, 3 Drawing Sheets

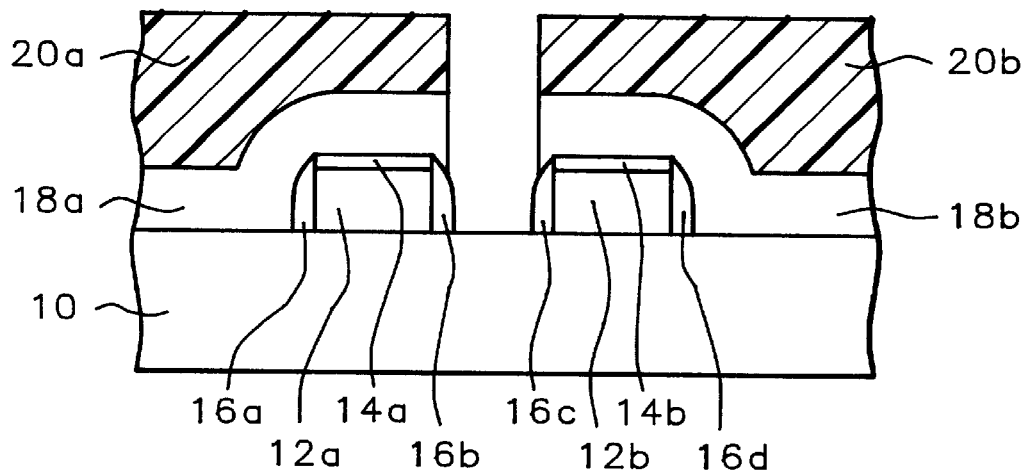
*FIG. 1 - Prior Art*
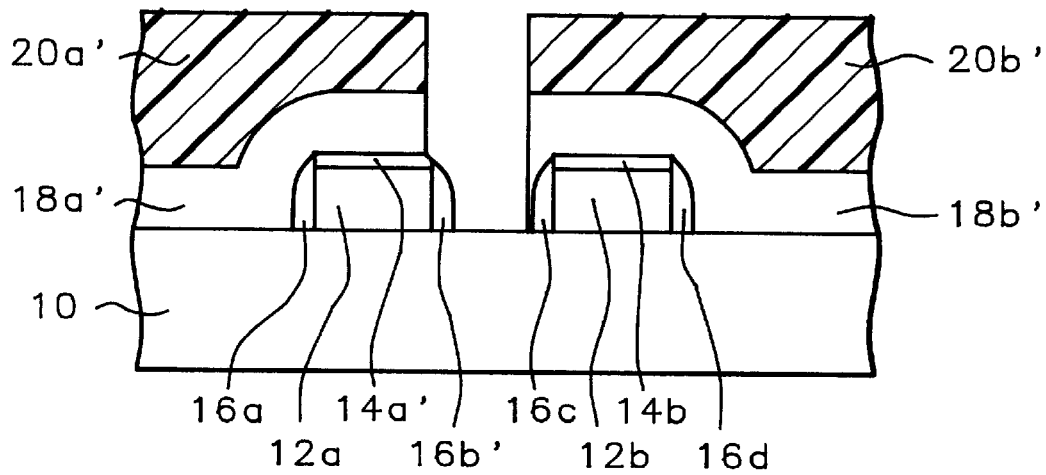
*FIG. 2 - Prior Art*

SELF-ALIGNED CONTACT (SAC) ETCHING USING POLYMER-BUILDING CHEMISTRY

BACKGROUND OF THE INVENTION

1. Field of the Invention

The present invention relates generally to methods for forming vias through dielectric layers within microelectronics fabrications. More particularly, the present invention relates to methods for forming self-aligned vias through dielectric layers within microelectronics fabrications.

2. Description of the Related Art

Integrated circuit microelectronics fabrications are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit microelectronics fabrication technology has advanced and integrated circuit microelectronics fabrication device dimensions have decreased, it has become increasingly important within advanced integrated circuit microelectronics fabrications to form through dielectric layers within those advanced integrated circuit microelectronics fabrications vias of minimal cross-sectional dimension and optimal registration. Vias of minimal cross-sectional dimension and optimal registration formed through dielectric layers within advanced integrated circuit microelectronics fabrications are particularly desirable when it is desired or required to form within an advanced integrated circuit microelectronics fabrication a via, such as a contact via or an interconnection via, through a portion of a dielectric layer between a pair of closely spaced integrated circuit structures, such as but not limited to a pair of closely spaced patterned integrated circuit conductor structures.

In order to form within integrated circuit microelectronics fabrications vias of minimal cross-sectional dimension and optimal registration through portions of dielectric layers which are separated by closely spaced integrated circuit structures within those integrated circuit microelectronics fabrications, it has become common in the art of advanced integrated circuit microelectronics fabrication to form vias through self-aligned methods which employ pairs of integrated circuit structures as registration aids in forming the vias. A schematic cross-sectional diagram illustrating an integrated circuit microelectronics fabrication through which such a via is formed is illustrated in FIG. 1.

Shown in FIG. 1 is a substrate 10 having formed thereupon a pair of patterned conductor layers 12a and 12b which is typically formed within an integrated circuit microelectronics fabrication from a polysilicon or a polycide conductor material. Each one of the patterned conductor layers 12a or 12b has formed and aligned thereupon a corresponding patterned conductor cap dielectric layer 14a or 14b. Formed adjoining the pair of patterned conductor stack layers formed of: (1) the patterned conductor layer 12a and the patterned conductor cap dielectric layer 14a; and (2) the patterned conductor layer 12b and the patterned conductor cap dielectric layer 14b, is a series of dielectric spacer layers 16a, 16b, 16c and 16d. There is also shown in FIG. 1 formed upon or over the substrate 10, including the structures which form the pair of patterned conductor stack layers, a pair of patterned pre-metal dielectric (PMD) layers 18a and 18b which are formed from a blanket pre-metal dielectric (PMD) layer while employing a pair of patterned photoresist layers 20a and 20b as a pair of patterned photoresist etch mask layers.

When forming the integrated circuit microelectronics fabrication whose schematic cross-sectional diagram is illustrated in FIG. 1, it is common to form the insulator spacer layers 16a, 16b, 16c and 16d from a first silicon oxide dielectric material which is at least slightly different from a second silicon oxide dielectric material which is employed in forming the patterned pre-metal dielectric (PMD) layers 18a and 18b. Thus, given an appropriate choice of etchant for etching a blanket pre-metal dielectric (PMD) layer from which is formed the patterned pre-metal dielectric (PMD) layers 18a and 18b, it is then possible to form within the integrated circuit microelectronics fabrication whose schematic cross-sectional diagram is illustrated in FIG. 1 the via defined by the patterned pre-metal dielectric (PMD) layers 18a and 18b with minimal, if any, etching of the dielectric spacer layers 16b and 16c.

While there may typically be formed within the integrated circuit microelectronics fabrication whose schematic cross-sectional diagram is illustrated in FIG. 1 the via defined by the patterned pre-metal dielectric layers 18a and 18b without substantially etching the dielectric spacer layers 16b and 16c by employing when forming the dielectric spacer layers 16a, 16b, 16c and 16d the first silicon oxide dielectric material which is different from the second silicon oxide dielectric material which is employed in forming the patterned pre-metal dielectric (PMD) layers 18a and 18b, there nonetheless exists problems in forming within the integrated circuit microelectronics fabrication whose schematic cross-sectional diagram is illustrated in FIG. 1 the via self-aligned with the dielectric spacer layers 16b and 16c when the patterned photoresist layers 20a and 20b are substantially mis-aligned with respect to the patterned conductor layers 12a and 12b. A schematic cross-sectional diagram illustrating one of the problems is shown in FIG. 2.

Shown in FIG. 2 is a schematic cross-sectional diagram of an integrated circuit microelectronics fabrication largely equivalent to the integrated circuit microelectronics fabrication whose schematic cross-sectional diagram is illustrated in FIG. 1, but wherein the patterned photoresist layers 20a and 20b have been mis-aligned with respect to the patterned conductor layers 12a and 12b, thus forming the mis-aligned patterned photoresist layers 20a' and 20b'. Similarly, there is also shown in FIG. 2 the mis-aligned patterned pre-metal dielectric (PMD) layers 18a' and 18b' which are formed when employing the mis-aligned patterned photoresist layers 20a' and 20b' as a photoresist etch mask layer. In addition, as is illustrated in FIG. 2, the mis-aligned patterned photoresist layers 20a' and 20b' are sufficiently mis-aligned such that there is also etched: (1) the patterned conductor cap dielectric layer 14a to form an etched patterned conductor cap dielectric layer 14a'; and (2) the dielectric spacer layer 16b to form the etched dielectric spacer layer 16b'.

As is understood by a person skilled in the art, the integrated circuit microelectronics fabrication whose schematic cross-sectional diagram is illustrated in FIG. 2 typically yields functionality and reliability problems in forming a fully functional or reliable integrated circuit microelectronics fabrication. The functionality and reliability problems are encountered when a conductor stud layer is formed into the via defined in part by the mis-aligned patterned pre-metal dielectric (PMD) layers 18a' and 18b', since the reduced thicknesses of the etched patterned conductor cap dielectric layer 14a' and the etched dielectric spacer layer 16b' at the upper edge of the patterned conductor layer 12a are more likely to inadequately insulate the patterned conductor layer 12a from the conductor stud layer.

It is thus towards the goal of forming through portions of dielectric layers between horizontally spaced microelectronic structures within microelectronics fabrications self-aligned vias with optimal cross-sectional profiles even under circumstances where there is mis-aligned patterned photoresist layers employed as etch mask layers in forming those vias that the present invention is generally directed.

Various methods have been disclosed in the art of microelectronics fabrication for etching dielectric layers within microelectronics fabrications.

For example, Dahm et al., in U.S. Pat. No. 5,431,778 discloses a dry etch method for selectively or non-selectively etching silicon containing material layers, such as silicon oxide layers, within integrated circuit microelectronics fabrications. The method employs a fluorine containing source material selected from either hydrogen fluoride or fluorine, and a carbon-oxygen source material selected from either carbon monoxide or carbon dioxide. Through the dry etch method there is avoided the use of atmospheric ozone depleting halocarbon etchant gases which are traditionally employed in etching silicon containing material layers within integrated circuit microelectronics fabrications.

In addition, Mihara et al., in U.S. Pat. No. 5,447,598 discloses a method for forming within an integrated circuit microelectronics fabrication a resist mask pattern employed upon a high step height topography substrate layer within the integrated circuit microelectronics fabrication. The high step height topography substrate layer may include a high step height topography dielectric substrate layer. The method employs a hard mask layer for patterning a planarizing resist layer formed upon the high step height topography substrate layer, where when patterning the planarizing resist layer there is employed along with an oxygen etchant gas a additional gas which forms a protective oxide layer on the sidewalls of a via formed through the planarizing resist layer.

Desirable in the art are additional self-aligned methods through which vias may be formed through portions of dielectric layers between microelectronic structures within microelectronics fabrications with optimal cross-sectional profiles, even under circumstances where there is mis-aligned a patterned photoresist layer employed as an etch mask layer in forming those vias. Particularly desirable in the art are additional self-aligned methods through which vias may be formed through portions of dielectric layers between integrated circuit microelectronic structures within integrated circuit microelectronics fabrications with optimal cross-sectional profiles, even under circumstances where there is mis-aligned a patterned photoresist layer employed as an etch mask layer in forming those vias. It is towards the foregoing goals that the present invention is more specifically directed.

SUMMARY OF THE INVENTION

A first object of the present invention is to provide a self-aligned method for forming a via through a portion of a dielectric layer between a pair of microelectronic structures within a microelectronics fabrication.

A second object of the present invention is to provide a method in accord with the first object of the present invention where the via is formed with optimal cross-sectional profile when there is mis-aligned upon the dielectric layer a patterned photoresist etch mask layer which is employed in forming the via.

A third object of the present invention is to provide a method in accord with the first object of the present invention or the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a method for forming a via through a dielectric layer within a microelectronics fabrication. To practice the method of the present invention, there is first provided a substrate employed within a microelectronics fabrication. There is then formed upon the substrate a pair of microelectronic structures. There is then formed conformally upon the substrate including the pair of microelectronic structures a first conformal dielectric layer. There is then formed conformally upon the first conformal dielectric layer a second conformal dielectric layer. There is then formed upon the second conformal dielectric layer a third dielectric layer, where the second conformal dielectric layer serves as an etch stop layer with respect to the third dielectric layer in a first plasma etch method employed in part in forming a via through the third dielectric layer, the second conformal dielectric layer and the first conformal dielectric layer at a location between the pair of microelectronic structures. The first plasma etch method employs an etchant gas composition which forms a passivating fluorocarbon polymer layer upon non-horizontal portions of the third dielectric layer, the second conformal dielectric layer and the first conformal dielectric layer. There is then formed upon the third dielectric layer a patterned photoresist layer which defines the location between the pair of microelectronic structures to be formed the via through the third dielectric layer, the second conformal dielectric layer and the first conformal dielectric layer. There is then etched through the first plasma etch method the third dielectric layer and the second conformal dielectric layer to form a partial via while forming the fluorocarbon passivating polymer upon non-horizontal portions of the third dielectric layer, the second conformal dielectric layer and the first conformal dielectric layer. Finally, there is then etched through a second plasma etch method the first conformal dielectric layer to form the via through the third dielectric layer, the second conformal dielectric layer and the first conformal dielectric layer. The via so formed reaches the substrate.

The present invention provides a self-aligned method for forming with optimal cross-sectional profile a via through a portion of a dielectric layer between a pair of microelectronic structures within a microelectronics fabrication, even when there is mis-aligned upon the dielectric layer a patterned photoresist etch mask layer which is employed in forming the via. The present invention realizes this object by employing when forming the via a tri-layer dielectric stack layer where the second (middle) conformal dielectric layer within the tri-layer dielectric stack layer serves as an etch stop layer and provides a difference in etch selectivity with respect to the third (upper) dielectric layer within the tri-layer dielectric stack layer and where there is also employed within the method a first plasma etch method through which there is etched a partial via through the third dielectric layer and the second conformal dielectric layer while simultaneously forming a passivating fluorocarbon polymer layer upon non-horizontal portions of the third dielectric layer, the second conformal dielectric layer and the first (lower) conformal dielectric layer. Given the presence of the passivating fluorocarbon polymer layer upon the non-horizontal portions of the third dielectric layer, the second conformal dielectric layer and the first conformal dielectric layer there may then be etched the via completely through the first dielectric layer through a second plasma etch method without substantially etching the microelectronic structures within the microelectronics fabrication, thus providing the via with optimal crosssectional profile, even when there is mis-aligned upon the tri-layer dielectric stack layer a patterned photoresist etch mask layer which is employed in forming the via.

The method of the present invention may be employed where the microelectronics fabrication is an integrated circuit microelectronics fabrication. Although the method of the present invention is most likely to be employed when forming a contact via through a dielectric layer separated by a pair of dielectric spacer layers which in turn insulates a pair of patterned conductor layers within an integrated circuit microelectronics fabrication, the method of the present invention may also be employed within microelectronic fabrications other than integrated circuit microelectronics fabrications when forming vias other than contact vias through portions of dielectric layers separated by other than dielectric spacer layers. In general, the method of the present invention does not discriminate with respect to the nature of the microelectronics fabrication, the nature of the via or the nature of the microelectronics structures between which is formed the via through the dielectric layer.

The method of the present invention is readily manufacturable. The method of the present invention employs a first plasma etch method which forms a passivating fluorocarbon polymer layer upon non-horizontal portions of a third dielectric layer, a second conformal dielectric layer and a first conformal dielectric layer within a tri-layer dielectric stack layer through which is formed a partial via through a portion of the third dielectric layer and the second conformal dielectric layer between a pair of microelectronics structures within a microelectronics fabrication within which is formed the tri-layer dielectric stack layer and the partial via. As is disclosed within the preferred embodiment of the method of the present invention, etchant gas compositions which may be employed within the first plasma etch method to form the passivating fluorocarbon polymer layer are generally known in the art of microelectronics fabrication. In addition, as is also disclosed within the preferred embodiment of the method of the present invention, materials through which may be formed the first conformal dielectric layer, the second conformal dielectric layer and the third dielectric layer within the tri-layer dielectric stack layer are also generally known in the art of microelectronics fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating a functionality and reliability problem encountered within an integrated circuit microelectronics fabrication when forming within the integrated circuit microelectronics fabrication a via through a portion of a dielectric layer between a pair of dielectric spacer layers which insulate a pair of patterned conductor layers within the integrated circuit microelectronics fabrication, through a method conventional in the art of integrated circuit microelectronics fabrication.

DESCRIPTION OF THE PREFERRED EMBODIMENT

Figure 3:
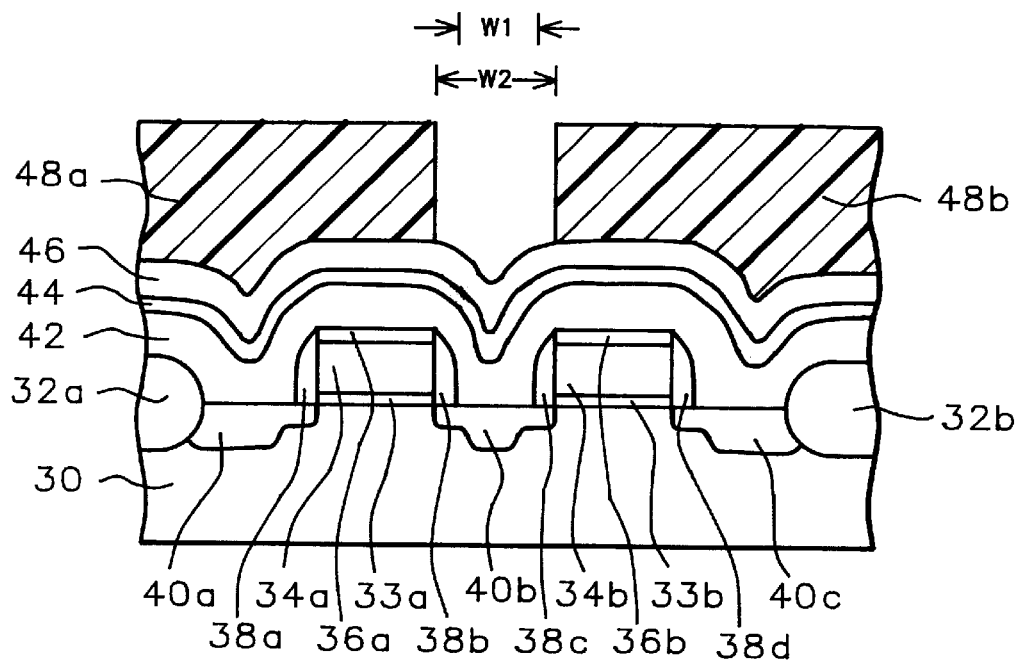
FIG. 3 to FIG. 6 show a series of schematic cross-sectional diagrams illustrating the results of progressive stages in forming in accord with the preferred embodiment of the method of the present invention a via through a portion of a dielectric layer separated by a pair of dielectric spacer layers which insulate a pair of patterned conductor layers within an integrated circuit microelectronics fabrication.

The present invention provides a self-aligned method for forming a via through a portion of a dielectric layer between a pair of microelectronic structures within a microelectronics fabrication with optimal cross-sectional profile, even when there is mis-aligned a patterned photoresist etch mask layer employed in defining the location of the via. The method of the present invention realizes this object by forming upon a substrate employed within a microelectronics fabrication a pair of microelectronic structures. There is then formed upon the substrate including the pair of microelectronic structures a tri-layer dielectric stack layer comprising a first conformal dielectric layer having formed thereupon a second conformal dielectric layer which in turn has formed thereupon a third dielectric layer, where the second conformal dielectric layer serves as an etch stop layer with respect to the third dielectric layer in a first plasma etch method employed in forming a partial via through the third dielectric layer and the second conformal dielectric layer at the location between the pair of microelectronic structures. The first plasma etch method employs an etchant gas composition which forms a passivating fluorocarbon polymer layer upon non-horizontal portions of the third dielectric layer, the second conformal dielectric layer and the first conformal dielectric layer. There is then formed upon the third dielectric layer a patterned photoresist layer which defines the location between the pair of microelectronic structures to be formed the via through the third dielectric layer, the second conformal dielectric layer and the first conformal dielectric layer. There is then etched through the first plasma etch method the third dielectric layer and the second conformal dielectric layer to form the partial via while forming the passivating fluorocarbon polymer layer upon nonhorizontal portions of the third dielectric layer, the second conformal dielectric layer and the first conformal dielectric layer. Finally, there is then etched through a second plasma etch method the first conformal dielectric layer to form from the via through the third dielectric layer, the second conformal dielectric layer and the first conformal dielectric layer, where the via so formed reaches the substrate.

While the preferred embodiment of the method of the present invention illustrates the method of the present invention employed in forming a contact via through a portion of a tri-layer pre-metal dielectric (PMD) stack layer between a pair of field effect transistors (FETs) formed upon a semiconductor substrate to access a source/drain region shared by the pair of field effect transistors (FETs) formed upon the semiconductor substrate, within an integrated circuit microelectronics fabrication, the method of the present invention may also be employed in forming vias other than contact vias through portions of tri-layer dielectric stack layers other than trilayer pre-metal dielectric (PMD) stack layers formed upon substrates other than semiconductor substrates to access structures within those substrates other than source/drain regions, within microelectronics fabrications other than integrated circuit microelectronics fabrications. In that regard, the method of the present invention may be employed in forming vias including but not limited to contact vias and interconnection vias through portions of tri-layer dielectric stack layers including but not limited to tri-layer pre-metal dielectric (PMD) stack layers, tri-layer inter-metal dielectric (IMD) stack layers and tri-layer passivation dielectric stack layers separated by microelectronic structures including but not limited to microelectronic conductor structures, microelectronic semiconductor structures and microelectronic dielectric structures formed upon substrates including but not limited to semiconductor substrates, solar cell substrates, ceramic packaging substrates and flat panel display substrates to access other microelectronic structures within those substrates including but not limited to other microelectronic conductor structures, other microelectronic semiconductor structures and other microelectronic insulator structures, within microelectronics fabrications including but not limited to integrated circuit microelectronics fabrications, solar cell microelectronics fabrications, ceramic packaging microelectronics fabrications and flat panel display microelectronics fabrications.

Referring now to FIG. 3 to FIG. 6, there is shown a series of schematic cross-sectional diagrams illustrating the results of progressive stages in forming in accord with the preferred embodiment of the method of the present invention a contact via through a portion of a tri-layer dielectric stack layer separated by a pair of field effect transistors (FETs) formed upon a semiconductor substrate to access a source/drain region shared by the pair of field effect transistors (FETs) formed upon the semiconductor substrate, within an integrated circuit microelectronics fabrication. Shown in FIG. 3 is a schematic cross-sectional diagram of the integrated circuit microelectronics fabrication at an early stage in practice of the method of the present invention.

Shown in FIG. 3 is a semiconductor substrate 30 having formed therein and thereupon a pair of isolation regions 32a and 32b which define an active region of the semiconductor substrate 30. Although it is known in the art of integrated circuit microelectronics fabrication that semiconductor substrates are available with either dopant polarity, various dopant concentrations and several crystallographic orientations, for the preferred embodiment of the method of the present invention, the semiconductor substrate 30 is preferably a (100) silicon semiconductor substrate having an N- or P- doping.

Similarly, although it is also known in the art of integrated circuit microelectronics fabrication that isolation regions may be formed within and/or upon semiconductor substrates through methods including but not limited to isolation region thermal growth methods and isolation region deposition/patterning methods, for the preferred embodiment of the method of the present invention, the isolation regions 32a and 32b are preferably formed within and upon the semiconductor substrate 30 through an isolation region thermal growth method at a temperature of from about 1000 to about 1200 degrees centigrade to form isolation regions 32a and 32b of silicon oxide within and upon the semiconductor substrate 30.

Shown also within FIG. 3 formed within and upon the active region of the semiconductor substrate 30 is a pair of field effect transistors (FETs) which comprise a series of structures including: (1) a pair of gate dielectric layers 33a and 33b having formed and aligned thereupon; (2) a pair of gate electrodes 34a and 34b which in turn have formed and aligned thereupon; (3) a pair of patterned gate electrode cap dielectric layers 36a and 36b; (4) a series of dielectric spacer layers 38a, 38b, 38c and 38d formed adjoining a pair of gate electrode stack layers formed from the gate dielectric layer 33a, the gate electrode 34a and the patterned gate electrode cap dielectric layer 36a, and the gate dielectric layer 33b, the gate electrode 34b and the patterned gate electrode cap dielectric layer 36b; and (5) a series of source drain regions 40a, 40b and 40c, where the source/drain region 40b is shared by the pair of field effect transistors (FETs). Each of the structures within the series of structures which comprise the pair of field effect transistors (FETs) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed through methods including but not limited to blanket gate dielectric layer thermal oxidation methods and blanket gate dielectric layer deposition/patterning methods, for the preferred embodiment of the method of the present invention, the gate dielectric layers 33a and 33b are preferably formed through patterning, through methods as are conventional in the art, of a blanket gate dielectric layer formed through a thermal oxidation method at a temperature of from about 700 to about 1000 degrees centigrade to form the blanket gate dielectric layer of silicon oxide of thickness about 20 to about 150 angstroms upon the active region of the semiconductor substrate 30.

Similarly, although it is also known in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon and polycides (doped polysilicon/metal silicide stacks), for the preferred embodiment of the method of the present invention, the gate electrodes 34a and 34b are preferably formed through patterning, through methods as are conventional in the art, of a blanket layer of a doped polysilicon or polycide gate electrode material layer formed upon the blanket gate dielectric to a thickness of from about 1000 to about 5000 angstroms.

Yet similarly, although it is also known in the art of field effect transistor (FET) fabrication that patterned gate electrode cap dielectric layers may be formed through patterning, through methods as are conventional in the art, of blanket gate electrode cap dielectric layers formed of gate electrode cap dielectric materials including but not limited to silicon oxide, silicon nitride and silicon oxynitride gate electrode cap dielectric materials, for the preferred embodiment of the present invention, the patterned gate electrode cap dielectric layers 36a and 36b are preferably formed through patterning, through methods as are conventional in the art, of a blanket gate electrode cap dielectric layer formed upon the blanket gate electrode material layer at a thickness of from about 200 to about 5000 angstroms of a silicon oxynitride gate electrode cap dielectric material.

Still yet similarly, although it is also known in the art of field effect transistor (FET) fabrication that dielectric spacer layers may be formed within field effect transistors (FETs) within integrated circuit microelectronics fabrications through anisotropic reactive ion etching methods through which are formed dielectric spacer layers of dielectric materials including but not limited to silicon oxide dielectric materials, silicon nitride dielectric materials and silicon oxynitride dielectric materials, for the preferred embodiment of the method of the present invention, the dielectric spacer layers 38a, 38b, 38c and 38d are preferably formed through either an anisotropic reactive ion etch (RIE), high density plasma (HDP) etch or electron cyclotron resonance (ECR) etch etching method as is conventional in the art of field effect transistor (FET) fabrication to form dielectric spacer layers 38a, 38b, 38c and 38d of a silicon oxide dielectric material formed through a plasma enhanced chemical vapor deposition (PECVD) method. Preferably the plasma enhanced chemical vapor deposition (PECVD) method employs silane as a silicon source material. Typically and preferably, the facing sidewalls of the dielectric spacer layers 38b and 38c are separated by a distance W1 upon the source/drain region 40b within the semiconductor substrate 30 of from about 0.1 to about 1.0 microns, as illustrated in FIG. 3.

Finally, it is also known in the art of field effect transistor (FET) fabrication that source/drain regions are typically formed through ion implantation methods employing dopant ions of polarity opposite the polarity of the semiconductor substrate within which is formed those source/drain regions. For the preferred embodiment of the method of the present invention, the source/drain regions 40a, 40b and 40c are preferably formed within the active region of the semiconductor substrate 30 through a low dose ion implant of from about 1E15 to about 1E17 ions per square centimeter and about 0.1 to about 200 keV while employing the patterned gate electrode cap dielectric layers 36a and 36b, the gate electrodes 34a and 34b and the gate dielectric layers 33a and 33b as an ion implantation mask followed by a high dose ion implant of from about 1E15 to about 1E17 ions per square centimeter and about 0.1 to about 200 keV while employing the patterned gate electrode cap dielectric layers 36a and 36b, the gate electrodes 34a and 34b, the gate dielectric layers 33a and 33b and the dielectric spacer layers 38a, 38b, 38c and 38d as an ion implantation mask. The low dose ion implant and the high dose ion implant are of polarity appropriate to the field effect transistors (FETs) and the semiconductor substrate 30.

There is also shown in FIG. 3 formed upon or over the semiconductor substrate 30 and the series of structures which forms the pair of field effect transistors (FETs) a series of three dielectric layers. The series of three dielectric layers includes: (1) a blanket first conformal dielectric layer 42 formed upon the semiconductor substrate 30 and upon or over the series of structures which forms the pair of field effect transistors (FETs); (2) a blanket second conformal dielectric layer 44 formed upon the blanket first conformal dielectric layer 42; and (3) a blanket third dielectric layer 46 formed upon the blanket second conformal dielectric layer 44. Within certain limitations, each of the preceding three dielectric layers may be formed through methods and materials as are conventional in the art of microelectronics fabrication.

In particular, within the preferred embodiment of the method of the present invention, the blanket second conformal dielectric layer 44 serves as an etch stop layer with respect to the blanket third dielectric layer 46 in a first plasma etch method employed in part in forming a via through the blanket third dielectric layer 46, the blanket second conformal dielectric layer 44 and the blanket first conformal dielectric layer 42 at a location between the pair of dielectric spacer layers 38b and 38c, in order to access the source/drain region 40b. Within the preferred embodiment of the method of the present invention, the first plasma etch method employs a first etchant gas composition which forms a passivating fluorocarbon polymer layer upon non-horizontal portions of the blanket third dielectric layer 46, the blanket second conformal dielectric layer 44 and the blanket first conformal dielectric layer 42 which are etched within the first plasma etch method. Thus, within the method of the present invention, the blanket first conformal dielectric layer 42 and the blanket second conformal dielectric layer 44 must exhibit a topography when formed over the series of structures which forms the pair of field effect transistors (FETs) as illustrated in FIG. 3. In contrast, although the blanket third dielectric layer 46 as illustrated in FIG. 3 is also shown as a conformal dielectric layer, the blanket third dielectric layer 46 need not necessarily be a conformal dielectric layer, although within the preferred embodiment of the method of the present invention the blanket third dielectric layer 46 is preferably a conformal dielectric layer.

Thus, although each of the blanket first conformal dielectric layer 42, the blanket second conformal dielectric layer 44 and the blanket third dielectric layer 46 may in general be formed through methods and materials as are conventional in the art of integrated circuit microelectronics fabrication, for the preferred embodiment of the method of the present invention the blanket second conformal dielectric layer 44 is formed of a different dielectric material from which is formed the blanket first conformal dielectric layer 42 or the blanket third dielectric layer 46. More preferably, within the preferred embodiment of the method of the present invention the blanket second conformal dielectric layer 44 is preferably formed of a silicon nitride dielectric material or a silicon oxynitride dielectric material, deposited through methods and materials as a conventional in the art of integrated circuit microelectronics fabrication. In contrast, the blanket first conformal dielectric layer 42 and the blanket third dielectric layer 46 are each preferably formed of a silicon oxide material, or an aggregate of layers formed of several silicon oxide dielectric materials, incorporating either doped silicon oxide materials or undoped silicon oxide materials, although is preferred that a doped silicon oxide material not be employed within a portion of the blanket first conformal dielectric layer 42 contacting the semiconductor substrate 30. Preferably, the silicon oxide materials from which are formed the blanket third dielectric layer 46 and the conformal first dielectric layer 42 are deposited preferably through thermal chemical vapor deposition (CVD) methods rather than plasma enhanced chemical vapor deposition (PECVD) methods.

Preferably, the blanket first conformal dielectric layer 42 is formed to a thickness of from about 500 to about 4000 angstroms upon the semiconductor substrate 30 including the series of structures which forms the pair of field effect transistors (FETs), while the blanket second conformal dielectric layer is 44 formed to a thickness of from about 100 to about 1000 angstroms upon the blanket first conformal dielectric layer 42, and while the blanket third dielectric layer 46 is formed to a thickness of from about 500 to about 8000 angstroms upon the blanket second conformal dielectric layer 44.

Finally, there is shown in FIG. 3 a pair of patterned photoresist layers 48a and 48b which are employed in defining a location through the tri-layer dielectric stack layer through which there is to be etched through the preferred embodiment of the method of the present invention the contact via accessing the source/drain region 40b shared by the pair of field effect transistors (FETs). Although it is known in the art of microelectronics fabrication that patterned photoresist layers may be formed from photoresist materials chosen from the general groups of photoresist materials including but not limited to positive photoresist materials and negative photoresist materials, for the preferred embodiment of the present invention, the patterned photoresist layers 48a and 48b are preferably formed of a positive photoresist material, in order to provide the patterned photoresist layers 48a and 48b with optimal dimensional stability. Other photoresist materials may, however, be employed in forming the patterned photoresist layers 48a and 48b. Preferably, each of the patterned photoresist layers 48a and 48b is formed to a thickness of from about 4000 to about 20000 angstroms upon the blanket third dielectric layer 46. Preferably, the aperture defined by the patterned photoresist layers 48a and 48b has a width W2 as illustrated in FIG. 3 of from about 0.5 to about 1.5 microns.

Figure 4:
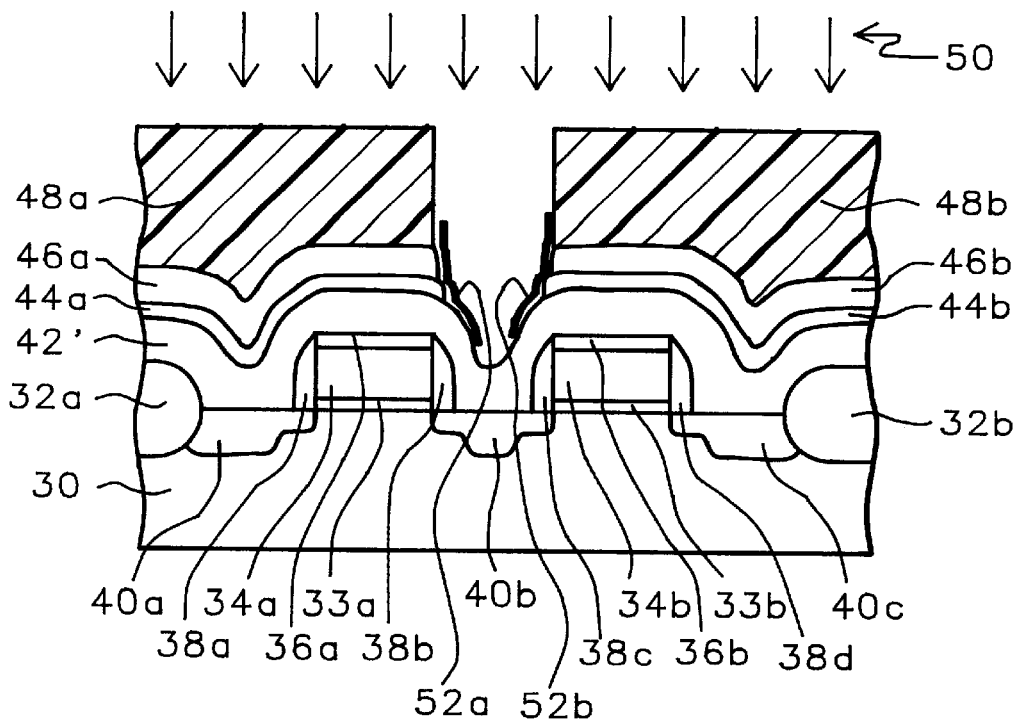

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is an integrated circuit microelectronics fabrication otherwise equivalent to the integrated circuit microelectronics fabrication whose schematic cross-sectional diagram is illustrated in FIG. 3, but wherein there has been etched through a first plasma 50 while employing the patterned photoresist layers 48a and 48b as patterned photoresist etch mask layers the blanket third dielectric layer 46, the blanket second conformal dielectric layer 44 and a slight portion of the blanket first conformal dielectric layer 42 to form the corresponding patterned third dielectric layers 46a and 46b, the corresponding patterned second conformal dielectric layers 44a and 44b and the corresponding partially etched blanket first conformal dielectric layer 42'. As is illustrated in FIG. 4, there is also formed upon non-horizontal portions of the patterned third dielectric layers 46a and 46b, the patterned second conformal dielectric layers 44a and 44b and the partially etched blanket first conformal dielectric layer 42' a pair of passivating fluorocarbon polymer layers 52a and 52b.

Within the preferred embodiment of the method of the present invention, where the blanket third dielectric layer 46 is formed of a silicon oxide dielectric material and the blanket conformal second dielectric layer 44 is formed of a silicon nitride dielectric material or a silicon oxynitride dielectric material, it has been found experimentally that the first plasma 50 preferably employs a first etchant gas composition which preferably comprises at least one fluorocarbon etchant gas and at least one carbon-oxygen source gas. For the preferred embodiment of the present invention, fluorocarbon etchant gases may include, but are not limited to hydrofluorocarbons and perfluorocarbons, while carbon-oxygen source gases may include, but are not limited to carbon monoxide and carbon dioxide. Within the preferred embodiment of the present invention, there may also be employed within the first etchant gas composition sputter source gases and non-reactive gases such as, but not limited to argon, nitrogen and helium. More preferably, the first plasma 50 employs a first etchant gas composition comprising carbon tetrafluoride, octafluorocyclobutane, carbon monoxide and argon. Yet more preferably, the first plasma 50 employs a first etchant gas composition consisting essentially of carbon tetrafluoride, octafluorocyclobutane, carbon monoxide and argon. When employing such a first etchant gas composition within the first plasma 50, an etch selectivity of the third dielectric layer 46 with respect to the conformal second dielectric layer 44 of from about 1.5:1 to about 5:1 may be obtained.

Preferably the first plasma 50 also employs: (1) a reactor chamber pressure of from about 0.1 to about 1000 mtorr (more preferably about 100 to about 200 mtorr); (2) a radio frequency power of from about 500 to about 3000 watts at a radio frequency of 380 kHz, 13.56 MHz, 2 MHz, 4 MHz or 2.65 GHz (as appropriate for reactive ion etch (RIE) methods, high density plasma (HDP) etch methods and electron cyclotron resonance (ECR) etch methods) (more preferably about 1000 to about 2000 watts at a radio frequency of 380 kHz); (3) a semiconductor substrate 30 temperature of from about 50 to about 300 degrees centigrade (more preferably from about 80 to about 150 degrees centigrade; (4) a carbon tetrafluoride flow rate of from about 1 to about 100 standard cubic centimeters per minute (sccm) (more preferably from about 5 to about 10 standard cubic centimeters per minute (sccm)); (5) an octafluorocyclobutane flow rate of from about 1 to about 100 standard cubic centimeters per minute (sccm) (more preferably from about 5 to about 10 standard cubic centimeters per minute (sccm)); (6) a carbon monoxide flow rate of from about 10 to about 500 standard cubic centimeters per minute (sccm) (more preferably from about 100 to about 200 standard cubic centimeters per minute (sccm)); and (7) an argon flow rate of from about 100 to about 1000 standard cubic centimeters per minute (sccm) (more preferably from about 400 to about 700 standard cubic centimeters per minute (sccm)).

The blanket third dielectric layer 46 and the blanket second conformal dielectric layer 44 are completely etched in forming the corresponding patterned third dielectric layers 46a and 46b and the corresponding patterned second conformal dielectric layers 44a and 44b as illustrated in FIG. 4, and the blanket first conformal dielectric layer 42 is partially etched to form the partially etched blanket first conformal dielectric layer 42' as illustrated in FIG. 4, to simultaneously yield the pair of passivating fluorocarbon polymer layers 52a and 52b of thickness about 50 to about 2000 angstroms.

Figure 5:
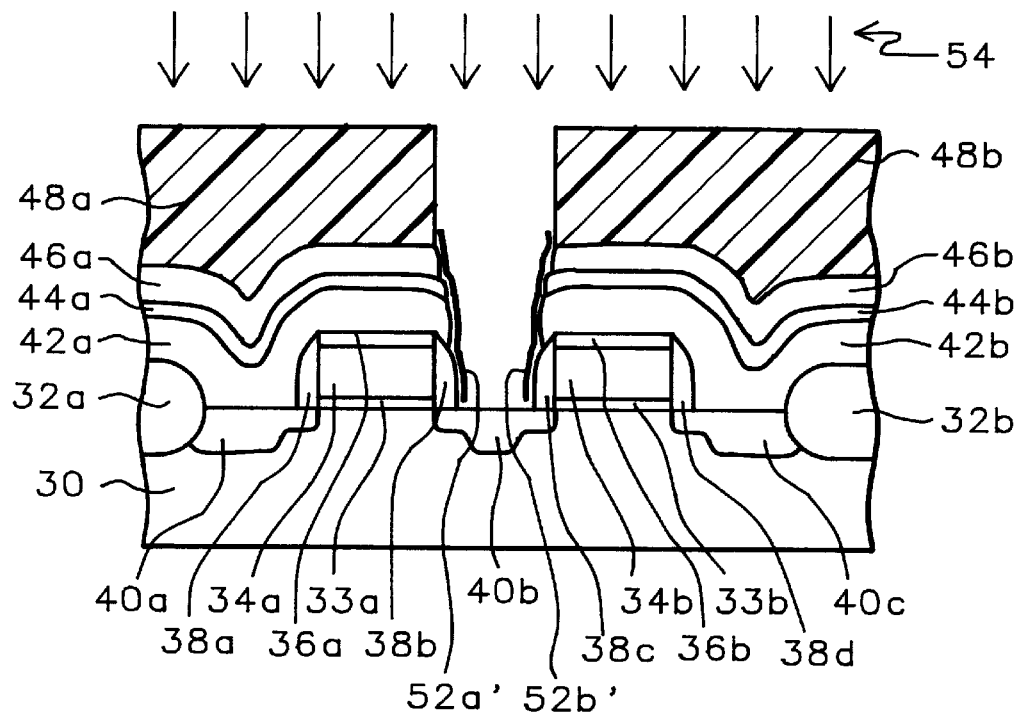

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the partially etched blanket first conformal dielectric layer 42' has been completely etched to form the patterned first conformal dielectric layers 42a and 42b, through exposure to a second plasma 54.

Within the preferred embodiment of the method of the present invention, the second plasma 54 employs a second etchant gas composition appropriate to the material from which is formed the partially etched blanket first conformal dielectric layer 42'. Within the preferred embodiment of the method of the present invention, where the partially etched blanket first conformal dielectric layer 42' is preferably formed of a silicon oxide dielectric material, and preferably undoped, the second plasma 54 preferably employs a second etchant gas composition comprising at least one fluorocarbon etchant gas without a carbon-oxygen source gas, since it is not desirable within the method of the present invention to continue to form passivating fluorocarbon polymer layers substantially beyond the extended passivating fluorocarbon polymer layers 52a' and 52b' as are shown in FIG. 5. With the exception of the preferred absence of the carbon-oxygen source gas, the second etchant gas composition employed within the second plasma 54 may be formed from fluorocarbon etchant gases, sputtering source gases and non-reactive gases analogous or equivalent to the fluorocarbon etchant gases, sputtering source gases and non-reactive gases employed within the first etchant gas composition employed within the first plasma 50. More preferably, the second etchant gas composition comprises trifluoromethane, carbon tetrafluoride and argon. Yet more preferably, the second etchant gas composition consists essentially of trifluoromethane, carbon tetrafluoride and argon.

Preferably, the second plasma 54 also employs: (1) a reactor chamber pressure of from about 0.1 to about 1000 mtorr (more preferably from about 200 to about 300 mtorr); (2) a radio frequency power of from about 500 to about 3000 watts at a radio frequency of 380 kHz, 13.56 MHz, 2 MHz, 4 MHz or 2.65 GHz (at appropriate for reactive ion etch (RIE) methods, high density plasma (HDP) methods and electron cyclotron resonance (ECR) methods) (more preferably about 1000 to about 2000 watts at a radio frequency of from about 13.56 MHZ); (3) a semiconductor substrate 30 temperature of from about 50 to about 300 degrees centigrade (more preferably from about 80 to about 150 degrees centigrade); (4) a trifluoromethane flow rate of from about 1 to about 100 standard cubic centimeters per minute (sccm) (more preferably from about 5 to about 15 standard cubic centimeters per minute (sccm)); (5) a carbon tetrafluoride flow rate of from about 1 to about 100 standard cubic centimeters per minute (sccm) (more preferably from about 40 to about 60 standard cubic centimeters per minute (sccm)); and (6) an argon flow rate of from about 100 to about 1000 standard cubic centimeters per minute (sccm) (more preferably from about 400 to about 700 standard cubic centimeters per minute (sccm)).

The partially etched blanket first conformal dielectric layer 42' is etched to form the patterned first conformal dielectric layers 42a and 42b until there is reached the semiconductor substrate 30 at the location of the source/drain region 40b. In so doing, the passivating fluorocarbon polymer layers 52a and 52b as illustrated in FIG. 4 are elongated in forming the extended passivating fluorocarbon polymer layers 52a' and 52b'. Due to the presence of the extended passivating fluorocarbon polymer layers 52a' and 52b', there is not substantially etched within the integrated circuit microelectronics fabrication whose schematic cross-sectional diagram is illustrated in FIG. 5 the structures which comprise the pair of field effect transistors (FETs), and in particular the patterned gate electrode cap dielectric layers 36a and 36b, and the dielectric spacer layers 38b and 38c, which comprise the pair of field effect transistors (FETs).

Figure 6:
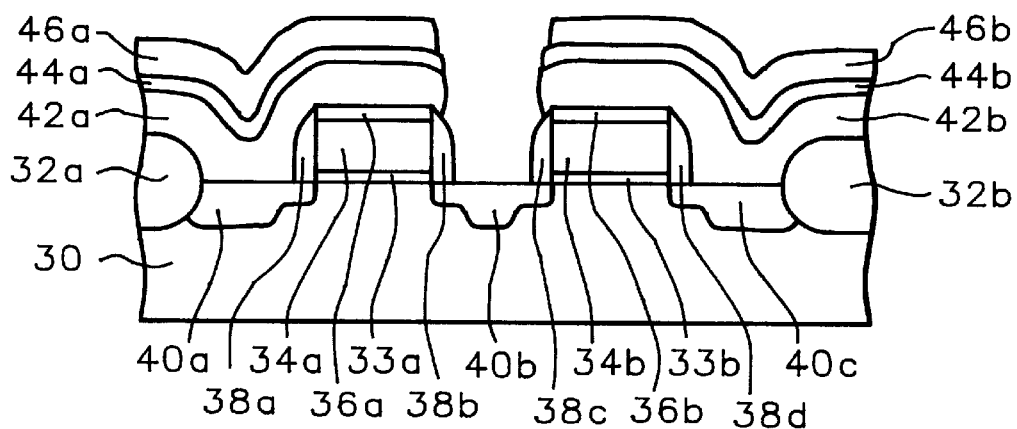

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is shown in FIG. 5, but wherein the patterned photoresist layers 48a and 48b and the extended passivating fluorocarbon polymer layers 52a' and 52b' have been stripped from the integrated circuit microelectronics fabrication. The patterned photoresist layers 48a and 48b, and the extended passivating fluorocarbon layers 52a' and 52b', may be stripped from the integrated circuit microelectronics fabrication whose schematic cross-sectional diagram is illustrated in FIG. 5 to form the integrated circuit microelectronics fabrication whose schematic cross-sectional diagram is illustrated in FIG. 6 through methods as are conventional in the art of integrated circuit microelectronics fabrication. Such methods will typically include, but are not limited to, wet chemical stripping methods and dry plasma stripping methods.

As is understood by a person skilled in the art, there may then be formed within the contact via accessing the source/drain region 40b shared by the pair of field effect transistors (FETs) within the integrated circuit microelectronics fabrication whose schematic cross-sectional diagram is illustrated in FIG. 6 a conductor contact stud layer with enhanced functionality and reliability, since the contact via is formed without etching the patterned gate electrode cap dielectric layers 36a or 36b or the dielectric spacer layers 38b or 38c.

Similarly, as is also understood by a person skilled in the art, although the preferred embodiment of the method of the present invention illustrates the method of the present invention employed in forming a contact via through a tri-layer pre-metal dielectric (PMD) stack layer accessing a source/drain region shared by a pair of field effect transistors (FETs) within an integrated circuit microelectronics fabrication, the preferred embodiment of the method of the present invention could equally well also illustrate: (1) an interconnection via formed through a portion of an upper lying tri-layer inter-metal dielectric (IMD) stack layer; or (3) a terminal via formed through a portion of an upper lying tri-layer passivation stack layer, between or upon a pair of integrated circuit structures overlying and further spaced from the pair of field effect transistors within the integrated circuit microelectronics fabrication. In such circumstances, an interconnection stud formed into the interconnection via or a terminal stud formed into the terminal via is formed with enhanced functionality and reliability since through the method of the present invention there is formed the interconnection via or terminal via with optimal sidewall profile and isolation from the integrated circuit structures.

As is yet understood by a person skilled in the art, the preferred embodiment of the method of the present invention is illustrative of the present invention rather than limiting of the present invention. Revisions and modifications may be made to methods, materials, structures and dimensions through which is provided the preferred embodiment of the method of the present invention while still providing embodiments which are within the spirit and scope of the method of the present invention, as defined by the accompanying claims.

What is claimed is:

1. A method for forming a via through a dielectric layer within a microelectronics fabrication comprising:

providing a substrate employed within a microelectronics fabrication;

forming over the substrate a pair of microelectronic structures;

forming conformally over the substrate including the pair of microelectronic structures a first conformal dielectric layer;

forming conformally upon the first conformal dielectric layer a second conformal dielectric layer;

forming upon the second conformal dielectric layer a third dielectric layer, where the second conformal dielectric layer serves as an etch stop layer with respect to the third dielectric layer in a first plasma etch method employed in forming a partial via completely through the third dielectric layer and the second conformal dielectric layer, but only partially through the first conformal dielectric layer, the partial via being formed at a location between the pair of microelectronic structures, the first plasma etch method employing an etchant gas composition which forms a passivating fluorocarbon polymer layer upon non-horizontal portions of the third dielectric layer, the second conformal dielectric layer and the first conformal dielectric layer;

forming upon the third dielectric layer a patterned photoresist layer which defines the location between the pair of microelectronic structures to be formed the partial via completely through the third dielectric layer and the second conformal dielectric layer and partially through the first conformal dielectric layer;

etching, while employing the first plasma etch method, completely through the third dielectric layer and the second conformal dielectric layer and only partially through the first conformal dielectric layer to form the partial via while forming the passivating fluorocarbon polymer layer upon non-horizontal portions of the third dielectric layer, the second conformal dielectric layer and the first conformal dielectric layer; and etching then while employing a second plasma etch method a remaining portion of the first conformal dielectric layer to form from the partial via a complete via through the third dielectric layer, the second conformal dielectric layer and the first conformal dielectric layer, the complete via so formed reaching the substrate.

2. The method of claim 1 wherein the complete via is formed through the third dielectric layer, the second conformal dielectric layer and the first conformal dielectric layer without substantially etching the pair of microelectronic structures.

3. The method of claim 1 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

4. The method of claim 1 wherein:

the microelectronics fabrication is an integrated circuit microelectronics fabrication; and the pair of horizontally spaced microelectronic structures is a pair of dielectric spacer layers which insulate a pair of patterned conductor layers within the integrated circuit microelectronics fabrication.

5. The method of claim 1 wherein:

the third dielectric layer is formed from a dielectric material chosen from the group of dielectric materials consisting of silicon oxide dielectric materials and doped silicon oxide dielectric materials;

the second conformal dielectric layer is formed from a dielectric material chosen from the group of dielectric materials consisting of silicon nitride dielectric materials and silicon oxynitride dielectric materials; and the first conformal dielectric layer is formed from a dielectric material chosen from the group of dielectric materials consisting of silicon oxide dielectric materials and doped silicon oxide dielectric materials.

6. The method of claim 5 wherein:

the first plasma etch method employs a first etchant gas composition comprising at least one fluorocarbon etchant gas and at least one carbon-oxygen source gas.

7. The method of claim 6 wherein:

the fluorocarbon etchant gas is chosen from the group of fluorocarbon etchant gases consisting of hydrofluorocarbons and perfluorocarbons; and the carbon-oxygen source gas is chosen from the group of carbon-oxygen source gases consisting of carbon monoxide and carbon dioxide.

8. The method of claim 7 wherein the first plasma etch method employs a first etchant gas composition comprising carbon tetrafluoride, octafluorocyclobutane and carbon monoxide.

9. The method of claim 6 wherein the second plasma etch method employs a second etchant gas composition comprising at least one fluorocarbon etchant gas without a carbon-oxygen source gas.

10. The method of claim 9 wherein the second plasma etch method employs a second etchant gas composition comprising trifluoromethane and carbon tetrafluoride.

* * * * *